United States Patent
Lu

(10) Patent No.: US 9,681,092 B1
(45) Date of Patent: Jun. 13, 2017

(54) CABLE TV AMPLIFIER SYSTEM

(71) Applicant: LANTEK ELECTRONICS INC., New Taipei (TW)

(72) Inventor: Shan-Jui Lu, New Taipei (TW)

(73) Assignee: LANTEK ELECTRONICS INC., New Taipei (TW)

(*) Notice: Subject to any disclaimer, the term of this patent is extended or adjusted under 35 U.S.C. 154(b) by 0 days.

(21) Appl. No.: 15/366,115

(22) Filed: Dec. 1, 2016

(30) Foreign Application Priority Data

Aug. 31, 2016 (TW) .............. 105127951 A

(51) Int. Cl.
| | |
|---|---|
| *H04N 5/14* | (2006.01) |
| *H04N 5/63* | (2006.01) |
| *H04N 7/10* | (2006.01) |
| *H03F 1/52* | (2006.01) |
| *H03F 3/04* | (2006.01) |

(52) U.S. Cl.
CPC .............. *H04N 7/102* (2013.01); *H03F 1/52* (2013.01); *H03F 3/04* (2013.01); *H04N 5/63* (2013.01); *H03F 2200/351* (2013.01); *H03F 2200/471* (2013.01)

(58) Field of Classification Search
CPC ...... H04N 7/102; H03F 1/52; H03F 2200/351
USPC ........ 348/707, 730, 706, 697; 725/127, 149, 725/129; 323/285, 276, 280; 363/34, 52, 363/56.04, 15
See application file for complete search history.

(56) References Cited

U.S. PATENT DOCUMENTS

| | | | | |
|---|---|---|---|---|
| 4,937,722 A | * | 6/1990 | Deierlein | H02M 3/156 323/285 |
| 9,032,468 B2 | * | 5/2015 | Bowler | H04N 7/22 725/129 |

* cited by examiner

*Primary Examiner* — Paulos M Natnael
*Assistant Examiner* — Jean W Desir
(74) *Attorney, Agent, or Firm* — Guice Patents PLLC

(57) ABSTRACT

A cable TV amplifier system, including: an amplifier module, including a body, a power connecting port, a signal input port, and a plurality of signal output ports; and a power converter, including an AC power input terminal, at least one DC power output terminal, and a switching power converting circuit for converting an AC voltage to a DC voltage to power the amplifier module; wherein, the switching power converting circuit includes a surge protection circuit, a bridge rectifying circuit, an energy transmission unit, a feedback unit, and a control unit, and the control unit will stop outputting a pulse width modulation signal when the AC voltage has an amplitude larger than a first level or smaller than a second level, the first level being higher than the second level.

10 Claims, 7 Drawing Sheets

CABLE TV AMPLIFIER SYSTEM

BACKGROUND OF THE INVENTION

Field of the Invention

The present invention relates to a cable TV amplifier system, especially to a cable TV amplifier system capable of effectively protecting an amplifier module thereof.

Description of the Related Art

A cable TV amplifier module generally has a power input port, a signal input port, and multiple signal output ports, wherein the power input port is generally directly connected to an AC (alternating current) power or connected to a power converter that performs a power conversion on an AC power. When the power input port is directly connected to an AC power, the cable TV amplifier module will install a power converting circuit inside to generate a DC (direct current) voltage to power internal circuits of the cable TV amplifier module.

Besides, to prevent the cable TV amplifier module from getting damaged by a surge coupled into a signal cable, the cable TV amplifier module generally has a surge protection circuit installed inside and located near a signal input port.

However, as general cable TV amplifier modules do not provide a protection means for dealing with a surge fed in from the power input port, the cable TV amplifier module can still get damaged by the surge. In addition, as general cable TV amplifier modules do not provide a processing means for processing noises fed in from the power input port, the signal amplification function of the cable TV amplifier module can be degraded by the noises.

To solve the foregoing problems, a novel cable TV amplifier system is needed.

SUMMARY OF THE INVENTION

One objective of the present invention is to disclose a cable TV amplifier system, which is capable of effectively preventing an amplifier module from getting malfunction or damaged due to a voltage surge or an abnormal power line voltage.

Another objective of the present invention is to disclose a cable TV amplifier system, which is capable of effectively preventing an amplifier module from getting damaged due to a voltage surge or an abnormal power line voltage by installing a protection means inside a power converter, the power converter being connected with the amplifier module via a coaxial cable, so that even if the voltage surge or the abnormal power line voltage causes damage to the cable TV amplifier system, the damage will be contained in the power converter and the amplifier module will not be impacted.

Another objective of the present invention is to disclose a cable TV amplifier system, which is capable of preventing a power cable and multiple signal cables that are connected with an amplifier module from getting kinked.

Another objective of the present invention is to disclose a cable TV amplifier system, which provides multiple rows of coaxial cable connecting ports at one side of a body of an amplifier module to allow a power cable and multiple signal cables to extend toward a same direction.

Still another objective of the present invention is to disclose a cable TV amplifier system, of which a switching power converting circuit includes a noise filtering circuit for filtering out the noises within an upstream frequency band.

To attain the foregoing objectives, a cable TV amplifier system is proposed, including:

an amplifier module, including a body, at least one circuit board, a power connecting port, a signal input port, and a plurality of signal output ports, the at least one circuit board being installed inside the body and including at least one signal amplifier, and all the power connecting port, the signal input port, and the plurality of signal output ports being installed on the body and electrically coupled with the at least one circuit board; and a power converter, including an AC power input terminal, at least one DC power output terminal, and a switching power converting circuit, the AC power input terminal being used for inputting an AC voltage, the switching power converting circuit being used for converting the AC voltage to a DC voltage, and one of the at least one DC power output terminal being coupled to the power connecting port to provide the DC voltage, the switching power converting circuit including:

a surge protection circuit coupled with the AC power input terminal;

a bridge rectifying circuit having a first input terminal and a first output terminal, the first input terminal being coupled with the surge protection circuit;

an energy transmission unit having a second input terminal, a second output terminal, and a control terminal, the second input terminal being coupled with the first output terminal of the bridge rectifying circuit, and the energy transmission unit transmitting energy to the second output terminal to provide the DC voltage under a control of a pulse width modulation signal applied to the control terminal;

a feedback unit coupled with the second output terminal to generate a feedback signal according to the DC voltage;

an AC voltage sensing circuit for generating a sensed level signal according to the AC voltage; and a control unit for generating the pulse width modulation signal according to the feedback signal, wherein, the control unit will stop outputting the pulse width modulation signal when the sensed level signal is in an abnormal state where the sensed level signal is higher than a first level or lower than a second level, the first level being higher than the second level.

In one embodiment, the control unit will restart generating the pulse width modulation signal after the abnormal state is eliminated.

In one embodiment, the power connecting port, the signal input port, and the plurality of signal output ports are installed at a same side of the body.

In one embodiment, the surge protection circuit includes a surge protection device.

In one embodiment, the energy transmission unit includes at least one inductor.

In one embodiment, the AC voltage sensing circuit includes at least two resistors in series.

In one embodiment, the body of the amplifier module has an upper side wall and a lower side wall for installing the power connecting port, the signal input port, and the plurality of signal output ports, and both the upper side wall and the lower side wall face a same direction.

In one embodiment, the power connecting port is connected with one of the at least one DC power output terminal of the power converter via a coaxial cable.

In one embodiment, the switching power converting circuit further includes a noise filtering circuit for filtering out noises within an upstream frequency band.

To attain the foregoing objectives, a power converter is proposed to power a cable TV amplifier module, the power converter including an AC power input terminal, at least one DC power output terminal, and a switching power converting circuit, the AC power input terminal being used for inputting an AC voltage, the switching power converting circuit being used for converting the AC voltage to a DC voltage, and one of the at least one DC power output terminal being coupled to the cable TV amplifier module via a coaxial cable to provide the DC voltage, the switching power converting circuit including:

a surge protection circuit coupled with the AC power input terminal;

a bridge rectifying circuit having a first input terminal and a first output terminal, the first input terminal being coupled with the surge protection circuit;

an energy transmission unit having a second input terminal, a second output terminal, and a control terminal, the second input terminal being coupled with the first output terminal of the bridge rectifying circuit, and the energy transmission unit transmitting energy to the second output terminal to provide the DC voltage under a control of a pulse width modulation signal applied to the control terminal; a feedback unit coupled with the second output terminal to generate a feedback signal according to the DC voltage;

an AC voltage sensing circuit for generating a sensed level signal according to the AC voltage; and a control unit for generating the pulse width modulation signal according to the feedback signal, wherein, the control unit will stop outputting the pulse width modulation signal when the sensed level signal is in an abnormal state where the sensed level signal is higher than a first level or lower than a second level, the first level being higher than the second level.

To make it easier for our examiner to understand the objective of the invention, its structure, innovative features, and performance, we use preferred embodiments together with the accompanying drawings for the detailed description of the invention.

DETAILED DESCRIPTION OF THE PREFERRED EMBODIMENTS

Figure 1:
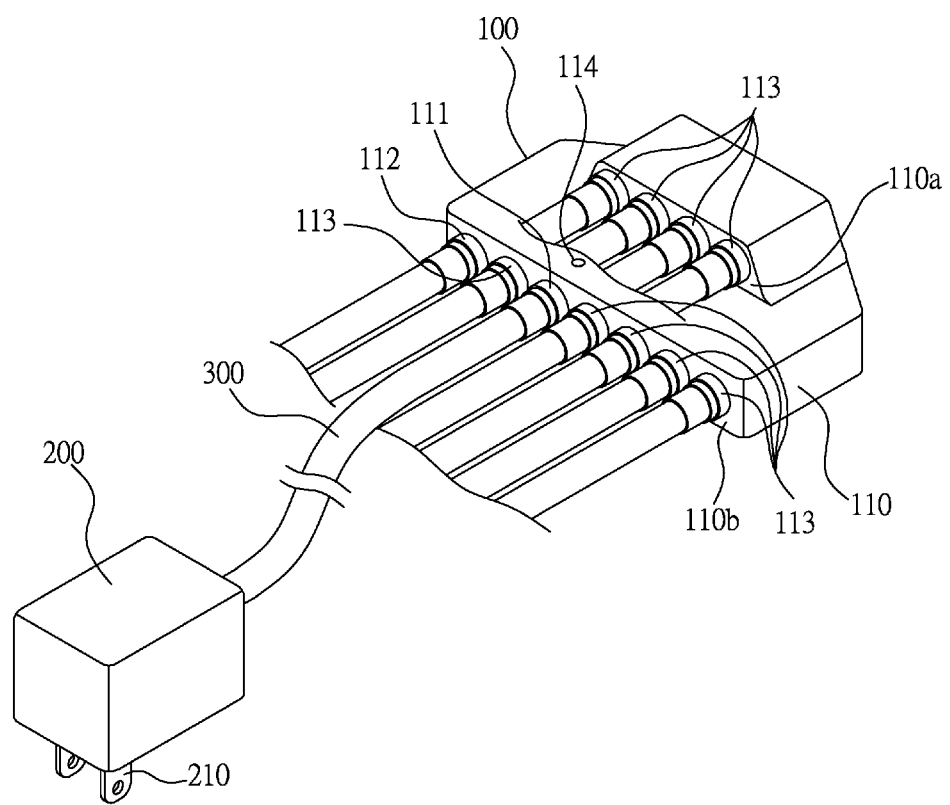
FIG. 1 illustrates an outline of a cable TV amplifier system according to one embodiment of the present invention.

Please refer to FIG. 1, which illustrates an outline of a cable TV amplifier system according to one embodiment of the present invention.

As illustrated in FIG. 1, the cable TV amplifier system includes an amplifier module 100 and a power converter 200, wherein the amplifier module 100 and the power converter 200 are connected via a coaxial cable 300.

Figure 2:
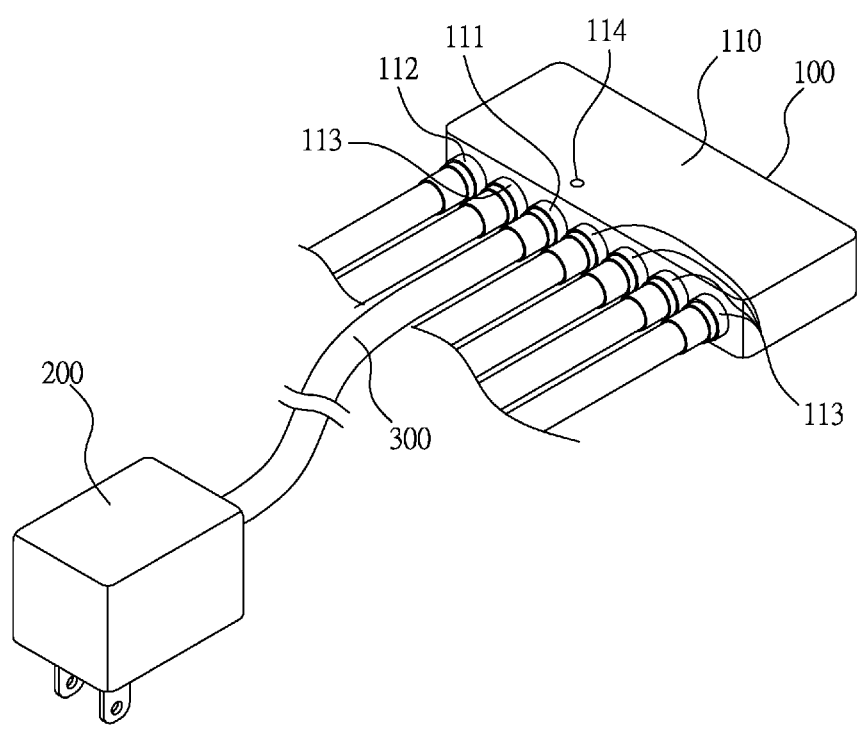
FIG. 2 illustrates an outline of a cable TV amplifier system according to another embodiment of the present invention.
Figure 3A:
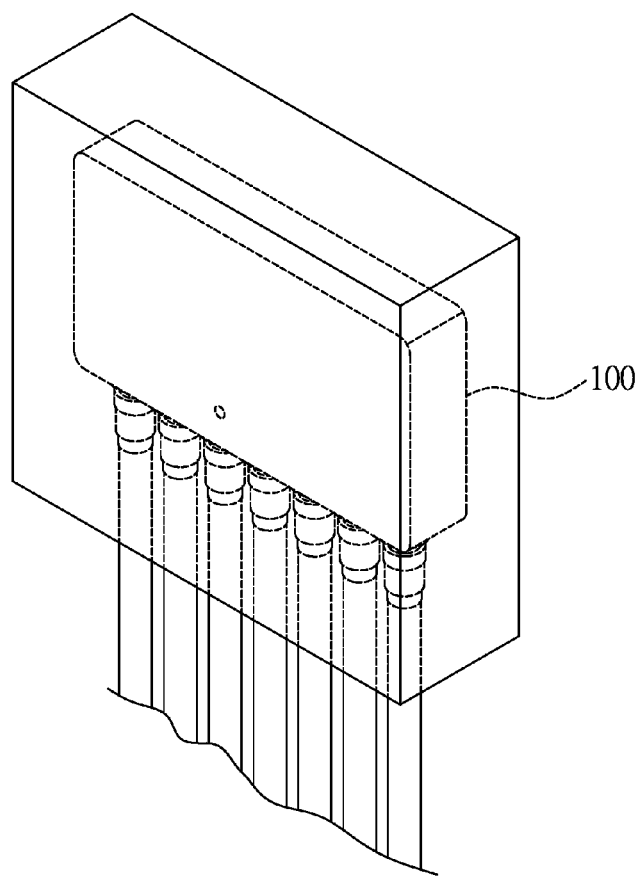
FIG. 3a illustrates a scenario of how cables are connected with an amplifier module of the present invention.
Figure 3B:
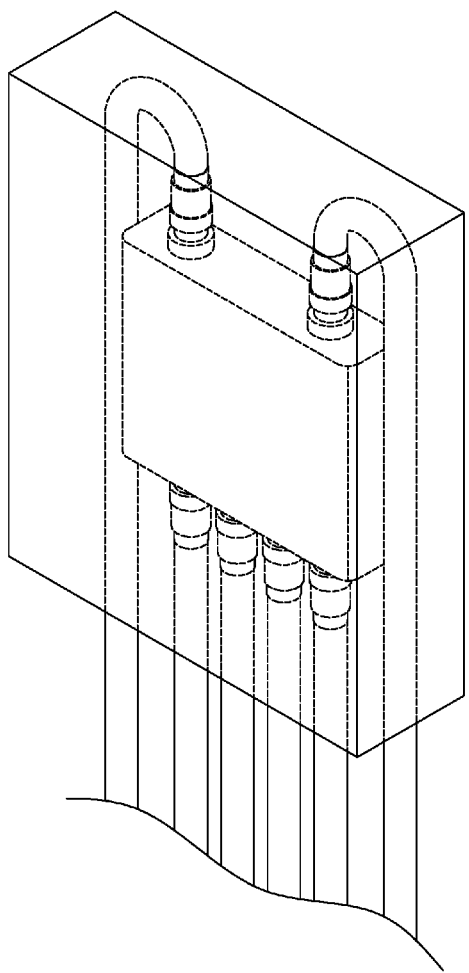
FIG. 3b illustrates a scenario of how cables are connected with a conventional amplifier module.

The amplifier module 100 includes a body 110, at least one circuit board (not shown in FIG. 1, the at least one circuit board being installed inside the body 110 and having at least one signal amplifier), a power connecting port 111, a signal input port 112, a plurality of signal output ports 113 and at least one light indicator 114, wherein all the power connecting port 111, the signal input port 112, the plurality of signal output ports 113 and the at least one light indicator 114 (used for indicating at least one operation state) are installed on the body 110 and coupled electrically with the at least one circuit board. In the embodiment illustrated in FIG. 1, all the power connecting port 111, the signal input port 112, and the plurality of signal output ports 113 are distributed on an upper side wall 110a and a lower side wall 110b of one side of the body 110, and both the upper side wall 110a and the lower side wall 110b face a same direction to prevent the coaxial cable 300 and multiple signal cables that are connected with the amplifier module 100 from getting kinked. In another embodiment, please refer to FIG. 2, all the power connecting port 111, the signal input port 112, and the plurality of signal output ports 113 are distributed on a same side wall of the body 110 to prevent the coaxial cable 300 and multiple signal cables that are connected with the amplifier module 100 from getting kinked. Please refer to FIG. 3a, which illustrates a scenario of how cables are connected with an amplifier module of the present invention; and FIG. 3b, which illustrates a scenario of how cables are connected with a conventional amplifier module. As can be seen in FIG. 3a and FIG. 3b, the cables connected with the conventional amplifier module get kinked, while the cables connected with the amplifier module of the present invention do not get kinked.

Figure 4A:
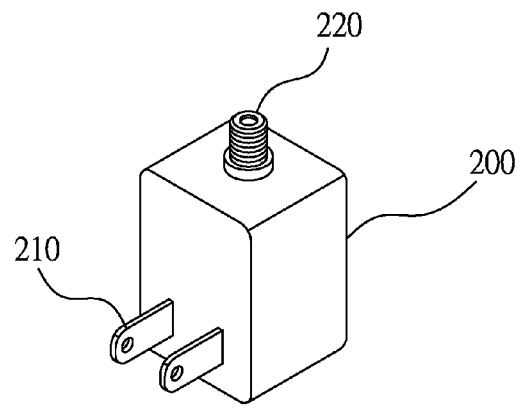
FIG. 4a-4b illustrates two outlines of the power converter of the cable TV amplifier system according to two embodiments of the present invention.
Figure 4B:
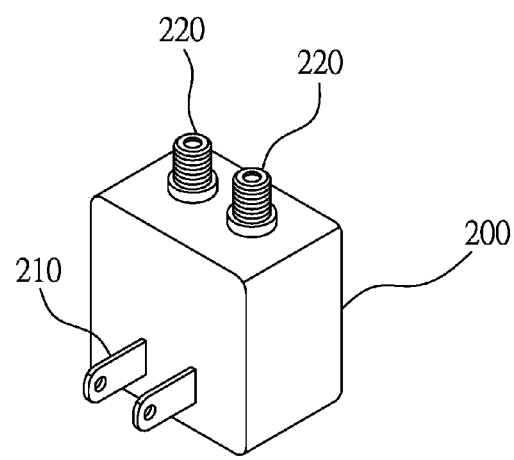

The power converter 200 includes an AC power input terminal 210, at least one DC power output terminal 220, and a switching power converting circuit (installed inside the power converter 200 but not shown in FIG. 1). Please refer to FIG. 4a-4b, which illustrates two outlines of the power converter of the cable TV amplifier system according to two embodiments of the present invention. As illustrated in FIG. 4a, the power converter 200 has one DC power output terminal 220, and in FIG. 4b, the power converter 200 has two DC power output terminals 220. The AC power input terminal 210 is used for inputting an AC voltage from a mains supply or from a solar cell module, the switching power converting circuit is for converting the AC voltage to a DC voltage, and the DC power output terminals 220 is for coupling with the power connecting port 111 to provide the DC voltage.

Figure 5:
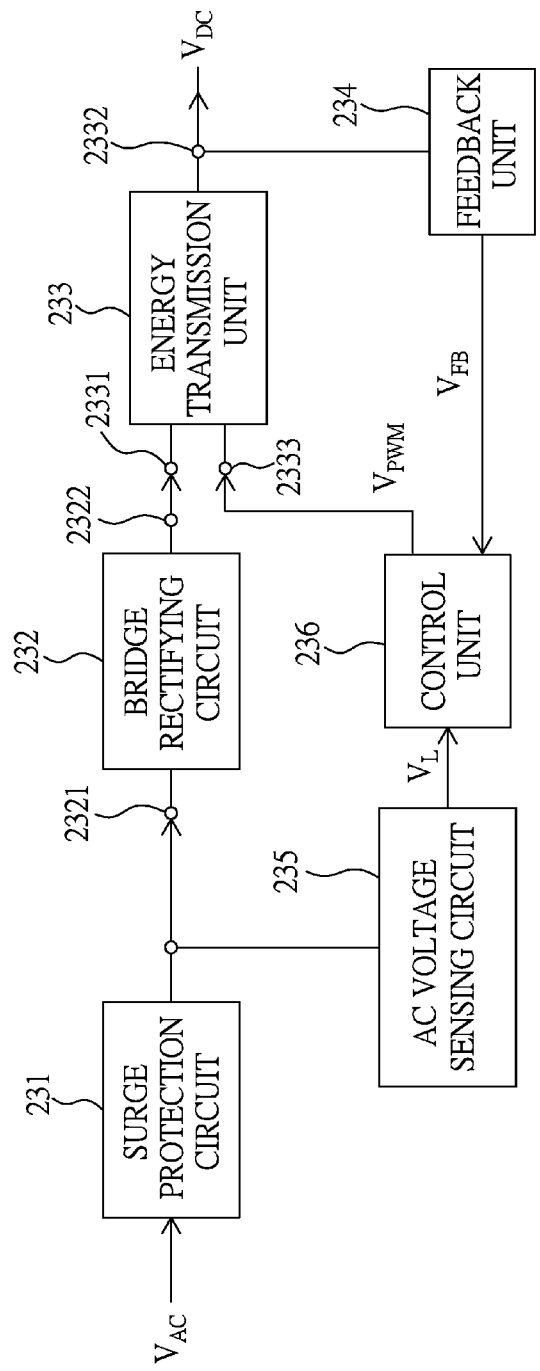
FIG. 5 illustrates a block diagram of a switching power converting circuit of the power converter of the cable TV amplifier system according to one embodiment of the present invention.

Please refer to FIG. 5, which illustrates a block diagram of a switching power converting circuit of the power converter of the cable TV amplifier system according to one embodiment of the present invention. As illustrated in FIG. 5, the switching power converting circuit includes a surge protection circuit 231, a bridge rectifying circuit 232, an energy transmission unit 233, a feedback unit 234, an AC voltage sensing circuit 235, and a control unit 236.

The surge protection circuit 231 is coupled with the AC power input terminal 210 to absorb a surge voltage. The surge protection circuit 231 includes a surge protection device, which is capable of restricting a transient overshoot voltage present at an AC power line to be within a rated voltage range that the amplifier module 100 can endure, or bypassing a surge current to a ground to provide a protection function.

The bridge rectifying circuit 232 has a first input terminal 2321 and a first output terminal 2322, the first input terminal 2321 being coupled with the surge protection circuit 231.

The energy transmission unit 233 has a second input terminal 2331, a second output terminal 2332, and a control terminal 2333, the second input terminal 2331 being coupled with the first output terminal 2322 of the bridge rectifying circuit 232, and the energy transmission unit 233 transmitting energy to the second output terminal 2332 via at least one inductor (not shown in FIG. 5) to provide the DC voltage under a control of a pulse width modulation signal $V_{PWM}$ applied to the control terminal 2333.

The feedback unit 234 is coupled with the second output terminal 2332 to generate a feedback signal $V_{FB}$ according to the DC voltage.

The AC voltage sensing circuit 235 is used for generating a sensed level signal $V_L$ according to the AC voltage, wherein the AC voltage sensing circuit 235 can include at least two resistors in series.

The control unit 236 is used for generating the pulse width modulation signal $V_{PWM}$ according to the feedback signal $V_{FB}$, and the control unit 236 will stop outputting the pulse width modulation signal $V_{PWM}$ to halt supply of power to the amplifier module 100 when the sensed level signal $V_L$ is in an abnormal state where the sensed level signal $V_L$ is higher than a first level (i.e., the amplitude of the AC voltage is too large) or lower than a second level (i.e., the amplitude of the AC voltage is too small), the first level being higher than the second level. Besides, the control unit 236 will restart generating the pulse width modulation signal $V_{PWM}$ to provide the DC voltage after the abnormal state is eliminated.

Figure 6:
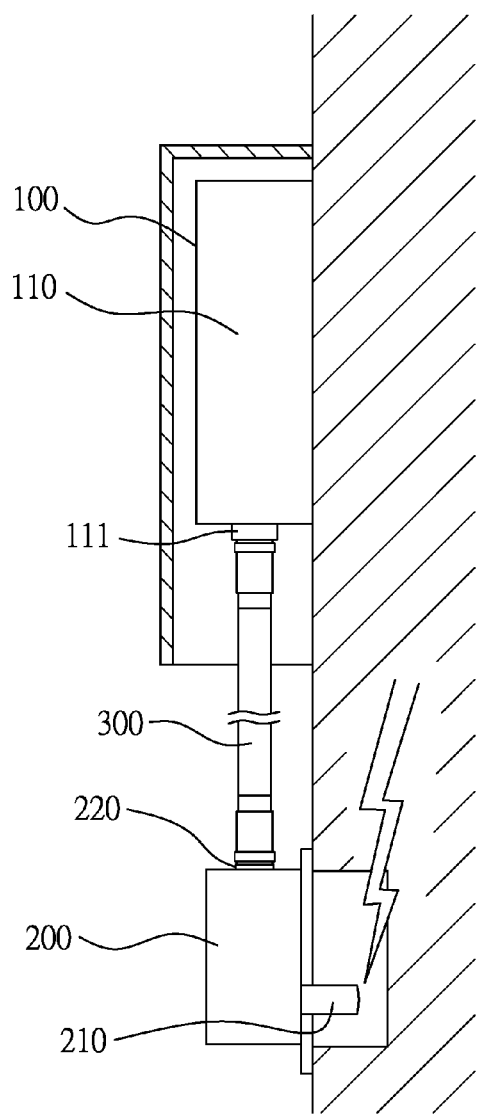
FIG. 6 illustrates a scenario that the amplifier module is not damaged when the cable TV amplifier system of the present invention experiences a surge.

As a result, when in operation, the novel structure of the present invention can effectively protect the amplifier module at instances where a surge voltage is present at the AC power line or the AC voltage is in an abnormal state of being too large or too small in amplitude. Please refer to FIG. 6, which illustrates a scenario that the amplifier module is not damaged when the cable TV amplifier system of the present invention experiences a surge.

In addition, the switching power converting circuit of the present invention can further provide a low load operation mode for a low load or no load condition so that the power converter of the present invention can have very low power consumption (around 0.1 Watt for example) when operating with a low load or no load.

In addition, due to the protection schemes on the power converter disclosed above, the lifetime of the power converter of the present invention can be greatly prolonged so that the repair service loading of a cable TV service provider can thereby be effectively relieved and the electronic waste of discarded power converters can be greatly reduced.

In addition, the switching power converting circuit can further include a noise filtering circuit (not shown in the figures) for filtering out noises within an upstream frequency band. The upstream frequency band can be (but not limited to) 5~42 $M_{HZ}$, and is used for users to upload data. As the noise filtering circuit can be implemented by common filter circuits, it will not be further addressed.

Thanks to the designs mentioned above, the present invention possesses the following advantages:

1. The cable TV amplifier system of the present invention can effectively prevent an amplifier module from getting malfunction or damaged due to a voltage surge or an abnormal power line voltage.

2. The cable TV amplifier system of the present invention can effectively prevent an amplifier module from getting damaged due to a voltage surge or an abnormal power line voltage by installing a protection means inside a power converter, the power converter being connected with the amplifier module via a coaxial cable, so that even if the voltage surge or the abnormal power line voltage causes damage to the cable TV amplifier system, the damage will be contained in the power converter and the amplifier module will not be impacted.

3. The cable TV amplifier system of the present invention can prevent a power cable and multiple signal cables that are connected with an amplifier module from getting kinked.

4. The cable TV amplifier system of the present invention can provide multiple rows of coaxial cable connecting ports at one side of a body of an amplifier module to allow a power cable and multiple signal cables to extend toward a same direction.

5. The cable TV amplifier system of the present invention can include a noise filtering circuit inside a switching power converting circuit to filter out the noises within an upstream frequency band.

6. The cable TV amplifier system of the present invention can provide a low load operation mode for a low load or no load condition so that the power converter of the present invention can have very low power consumption when operating with a low load or no load.

7. The cable TV amplifier system of the present invention uses a protection scheme to prolong the lifetime of the power converter so that the repair service loading of a cable TV service provider can thereby be effectively relieved and the electronic waste of discarded power converters can be greatly reduced.

While the invention has been described by way of example and in terms of preferred embodiments, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

In summation of the above description, the present invention herein enhances the performance over the conventional structure and further complies with the patent application requirements and is submitted to the Patent and Trademark Office for review and granting of the commensurate patent rights.

What is claimed is:

1. A cable TV amplifier system, including:
   an amplifier module, including a body, at least one circuit board, a power connecting port, a signal input port, and a plurality of signal output ports, the at least one circuit board being installed inside the body and including at least one signal amplifier, and all the power connecting port, the signal input port, and the plurality of signal output ports being installed on the body and electrically coupled with the at least one circuit board; and
   a power converter, including an AC power input terminal, at least one DC power output terminal, and a switching power converting circuit, the AC power input terminal being used for inputting an AC voltage, the switching power converting circuit being used for converting the AC voltage to a DC voltage, and one of the at least one DC power output terminal being coupled to the power connecting port to provide the DC voltage, the switching power converting circuit including:
   a surge protection circuit coupled with the AC power input terminal;

a bridge rectifying circuit having a first input terminal and a first output terminal, the first input terminal being coupled with the surge protection circuit;

an energy transmission unit having a second input terminal, a second output terminal, and a control terminal, the second input terminal being coupled with the first output terminal of the bridge rectifying circuit, and the energy transmission unit transmitting energy to the second output terminal to provide the DC voltage under a control of a pulse width modulation signal applied to the control terminal;

a feedback unit coupled with the second output terminal to generate a feedback signal according to the DC voltage;

an AC voltage sensing circuit for generating a sensed level signal according to the AC voltage; and a control unit for generating the pulse width modulation signal according to the feedback signal, wherein, the control unit will stop outputting the pulse width modulation signal when the sensed level signal is in an abnormal state where the sensed level signal is higher than a first level or lower than a second level, the first level being higher than the second level.

2. The cable TV amplifier system as disclosed in claim 1, wherein the control unit will restart generating the pulse width modulation signal after the abnormal state is eliminated.

3. The cable TV amplifier system as disclosed in claim 1, wherein the power connecting port, the signal input port, and the plurality of signal output ports are installed at a same side of the body.

4. The cable TV amplifier system as disclosed in claim 1, wherein the surge protection circuit includes a surge protection device.

5. The cable TV amplifier system as disclosed in claim 1, wherein the energy transmission unit includes at least one inductor.

6. The cable TV amplifier system as disclosed in claim 1, wherein the AC voltage sensing circuit includes at least two resistors in series.

7. The cable TV amplifier system as disclosed in claim 1, wherein the body of the amplifier module has an upper side wall and a lower side wall for installing the power connecting port, the signal input port, and the plurality of signal output ports, and both the upper side wall and the lower side wall face a same direction.

8. The cable TV amplifier system as disclosed in claim 1, wherein the power connecting port is connected with one of the at least one DC power output terminal of the power converter via a coaxial cable.

9. The cable TV amplifier system as disclosed in claim 1, wherein the switching power converting circuit further includes a noise filtering circuit for filtering out noises within an upstream frequency band.

10. A power converter for powering a cable TV amplifier module, the power converter including an AC power input terminal, at least one DC power output terminal, and a switching power converting circuit, the AC power input terminal being used for inputting an AC voltage, the switching power converting circuit being used for converting the AC voltage to a DC voltage, and one of the at least one DC power output terminal being coupled to the cable TV amplifier module via a coaxial cable to provide the DC voltage, the switching power converting circuit including:

a surge protection circuit coupled with the AC power input terminal;

a bridge rectifying circuit having a first input terminal and a first output terminal, the first input terminal being coupled with the surge protection circuit;

an energy transmission unit having a second input terminal, a second output terminal, and a control terminal, the second input terminal being coupled with the first output terminal of the bridge rectifying circuit, and the energy transmission unit transmitting energy to the second output terminal to provide the DC voltage under a control of a pulse width modulation signal applied to the control terminal;

a feedback unit coupled with the second output terminal to generate a feedback signal according to the DC voltage;

an AC voltage sensing circuit for generating a sensed level signal according to the AC voltage; and a control unit for generating the pulse width modulation signal according to the feedback signal, wherein, the control unit will stop outputting the pulse width modulation signal when the sensed level signal is in an abnormal state where the sensed level signal is higher than a first level or lower than a second level, the first level being higher than the second level.

* * * * *